United States Patent
Swaans et al.

(10) Patent No.: US 11,956,029 B2
(45) Date of Patent: Apr. 9, 2024

(54) SYSTEM AND METHOD FOR TESTING OF WIRELESS POWER EQUIPMENT

(71) Applicant: ELECTDIS AB, Malmö (SE)

(72) Inventors: Laurens Swaans, Malmö (SE); Max Andersson, Malmö (SE)

(73) Assignee: NOK9 AB, Malmo (SE)

( * ) Notice: Subject to any disclaimer, the term of this patent is extended or adjusted under 35 U.S.C. 154(b) by 727 days.

(21) Appl. No.: 17/059,848

(22) PCT Filed: May 31, 2019

(86) PCT No.: PCT/EP2019/064170
§ 371 (c)(1),
(2) Date: Nov. 30, 2020

(87) PCT Pub. No.: WO2019/229229
PCT Pub. Date: Dec. 15, 2019

(65) Prior Publication Data
US 2021/0226667 A1    Jul. 22, 2021

(30) Foreign Application Priority Data

Jun. 1, 2018  (EP) .................... 18175611
Nov. 2, 2018  (EP) .................... 18204141

(51) Int. Cl.
*H04B 5/79* (2024.01)
*G01R 1/07* (2006.01)
(Continued)

(52) U.S. Cl.
CPC ............. *H04B 5/79* (2024.01); *G01R 1/07* (2013.01); *G01R 15/18* (2013.01);
(Continued)

(58) Field of Classification Search
CPC .. H04B 5/0037; H04B 5/0075; H04B 5/0093; H04B 5/0043; H02J 50/80; H02J 50/10;
(Continued)

(56) References Cited

U.S. PATENT DOCUMENTS 8,890,470 B2 * 11/2014 Partovi .................. H02J 50/90
                                                       320/108
2013/0285604 A1  10/2013 Partovi
(Continued)

FOREIGN PATENT DOCUMENTS

CN    206773017 U    12/2017
EP    3073609 A1      9/2016
(Continued)

OTHER PUBLICATIONS

Korean Officed Action issued in Application No. 10-2020-7035874 dated Apr. 4, 2023, 8 pages.(English Translation).
(Continued)

*Primary Examiner* — Keith Ferguson
(74) *Attorney, Agent, or Firm* — Honigman LLP (57) ABSTRACT

A system (100) for testing of wireless power equipment in the form of a wireless power transmitter device and a wireless power receiver device is disclosed. The system (100) has a probe device (110) and an analyzer device (130). The probe device (110) has at least one pickup coil (112), the pickup coil being adapted to be placed between a surface of a housing of the wireless power transmitter device and a surface of a housing of the wireless power receiver device to generate electric signals by capturing electromagnetic signals exchanged between the wireless power transmitter and receiver devices pursuant to a wireless power transfer protocol. The probe device (110) also has an interface (114) for providing the electric signals generated by the pickup coil (112) to the analyzer device (130). The analyzer device
(Continued)

(130) has an interface (132) for receiving the electric signals from the probe device (110). The analyzer device (130) also has a processing unit (134) coupled to the interface (132) and configured for processing of the received electric signals. The system further includes means (136; 138) for causing manipulation of the electromagnetic signals exchanged between the wireless power transmitter and receiver devices.

24 Claims, 6 Drawing Sheets

(51) Int. Cl.
| | | |
|---|---|---|
| *G01R 15/18* | (2006.01) | |
| *G01R 29/08* | (2006.01) | |
| *H02J 50/10* | (2016.01) | |
| *H02J 50/60* | (2016.01) | |
| *H02J 50/80* | (2016.01) | |
| *H04B 5/73* | (2024.01) | |

(52) U.S. Cl.
CPC ..... *G01R 29/0807* (2013.01); *G01R 29/0892* (2013.01); *H02J 50/10* (2016.02); *H02J 50/60* (2016.02); *H02J 50/80* (2016.02); *H04B 5/73* (2024.01)

(58) Field of Classification Search
CPC ..... H02J 50/60; G01R 1/067; G01R 29/0892; G01R 29/0807; G01R 15/18; G01R 1/07
See application file for complete search history.

(56) References Cited

U.S. PATENT DOCUMENTS

| | | | |
|---|---|---|---|
| 2015/0204949 A1 | 7/2015 | Von Novak, III | |
| 2016/0359371 A1* | 12/2016 | Wikstrand | H02J 50/12 |
| 2019/0067979 A1* | 2/2019 | van der Sluys | A41D 27/205 |
| 2019/0068001 A1* | 2/2019 | Lovas | H02J 50/10 |
| 2021/0408827 A1* | 12/2021 | Partovi | H02J 7/0013 |

FOREIGN PATENT DOCUMENTS

| | | |
|---|---|---|
| KR | 20170007756 A | 1/2017 |
| WO | 2018069478 A1 | 4/2018 |

OTHER PUBLICATIONS

International Search Report for PCT/EP2019/064170 dated Aug. 13, 2019.

* cited by examiner

200
A method for testing of wireless power equipment in the form of a wireless power transmitter device 20 and a wireless power receiver device 10

210
Placing a probe device 110 having a pickup coil 112 between a surface of a housing of the wireless power transmitter device 20 and a surface of a housing of the wireless power receiver device 10

220
Operating the wireless power transmitter device 20 and the wireless power receiver device 10 to communicate pursuant to a wireless power transfer protocol

225
Causing manipulation of electromagnetic signals 18 exchanged between the wireless power transmitter and receiver devices 20, 10

230
By the pickup coil 112 of the probe device 110 being placed between the surfaces of the housings of the wireless power transmitter and receiver devices 20, 10, generating electric signals by capturing the electromagnetic signals 18 exchanged between the wireless power transmitter and receiver devices 20, 10

240
Providing, by the probe device 110, the generated electric signals to an analyzer device 130

250
Receiving, by the analyzer device 130, the generated electric signals from the probe device 110

260
Processing, by the analyzer device 130, the received electric signals

*Fig. 7*

SYSTEM AND METHOD FOR TESTING OF WIRELESS POWER EQUIPMENT

CROSS-REFERENCE TO RELATED APPLICATIONS

This application is a 35 USC § 371 United States national stage application of International Application No. PCT/EP2019/064170, filed May 31, 2019, which claims priority to European Patent Application EP18175611.5, filed Jun. 1, 2018 and to European Patent Application EP18204141.8.0, filed Nov. 2, 2018.

TECHNICAL FIELD

The present invention generally relates to the field of wireless power, and more specifically to testing of wireless power equipment. Even more specifically, the present invention relates to a system for testing of wireless power equipment in the form of a wireless power transmitter device and a wireless power receiver device. The present invention also relates to an associated method.

BACKGROUND

Wireless power transfer is expected to become increasingly popular, for instance for wireless battery charging of mobile devices such as, for instance, mobile terminals, tablet computers, laptop computers, cameras, audio players, rechargeable toothbrushes, wireless headsets, as well as various other consumer products and appliances.

The Wireless Power Consortium has developed a wireless power transfer standard known as Qi. Other known wireless power transfer approaches include Alliance for Wireless Power, and Power Matters Alliance.

The wireless power transfer standard known as Qi by the Wireless Power Consortium will be referred to, without limitation, throughout this document as the presently preferred wireless power transfer manner applicable to the present invention. However, the invention may generally be applied also to other wireless power transfer standards or approaches, including but not limited to the ones mentioned above. Operation of devices that comply with Qi relies on magnetic induction between planar coils. Two kinds of devices are involved, namely devices that provide wireless power (referred to as base stations or wireless power transmitter devices), and devices that consume wireless power (referred to as mobile devices). Power transfer takes place from a base station to a mobile device. For this purpose, a base station contains a subsystem (a power transmitter) that comprises a primary coil, whereas a mobile device contains a subsystem (a power receiver) that comprises a secondary coil. In operation, the primary coil and the secondary coil will constitute the two halves of a coreless resonant transformer. Typically, a base station has a flat surface, on top of which a user can place one or more mobile devices (also typically having a flat surface), so as to enjoy wireless battery charging or operational power supply for the mobile device(s) placed on the base station.

There is a need among different interest groups to test, measure or evaluate the behavior of the base station and/or the power receiver (mobile device) when performing wireless power transfer. Such interest groups may for instance involve any of the following: developers, manufacturers or suppliers of mobile devices; developers, manufacturers or suppliers of wireless power transmitter devices; test or compliance entities in the field of wireless power transfer; and test or compliance entities in the field of consumer product safety.

SUMMARY

It is an object of the invention to offer improvements in testing of wireless power equipment.

A first aspect of the present invention is a system for testing of wireless power equipment in the form of a wireless power transmitter device and a wireless power receiver device. The system comprises a probe device and an analyzer device.

The probe device in the system comprises at least one pickup coil. The pickup coil is adapted to be placed between a surface of a housing of the wireless power transmitter device and a surface of a housing of the wireless power receiver device to generate electric signals by capturing electromagnetic signals exchanged between the wireless power transmitter and receiver devices pursuant to a wireless power transfer protocol. The probe device also comprises an interface for providing the electric signals generated by the pickup coil to an analyzer device.

The analyzer device in the system comprises an interface for receiving the electric signals generated by the pickup coil of the probe device, when the probe device is placed between the surface of the housing of the wireless power transmitter device and the surface of the housing of the wireless power receiver device and captures the electromagnetic signals exchanged between the wireless power transmitter and receiver devices. The analyzer device further comprises a processing unit coupled to the interface and configured for processing of the received electric signals.

The system moreover comprises means for causing manipulation of the electromagnetic signals exchanged between the wireless power transmitter and receiver devices. The means for causing manipulation may advantageously be controllable by the processing unit of the analyzer device.

In some embodiments, the means for causing manipulation of the electromagnetic signals comprises a resistive element coupled to impose a controllable load on the pickup coil of the probe device, the resistive element being controllable by the processing unit of the analyzer device.

Such a system may for instance be configured for controllable interception, by the resistive element, of wireless power transmitted by the wireless power transmitter device, so as to cause transfer of less wireless power than expected between the wireless power transmitter and receiver devices.

In some embodiments, the means for causing manipulation of the electromagnetic signals comprises an AM modulator for causing an amplitude modulation of the electromagnetic signals exchanged between the wireless power transmitter and receiver devices, the AM modulator being controllable by the processing unit of the analyzer device.

The means for causing manipulation may beneficially be used for various different test scenarios.

Accordingly, in some embodiments, the processing unit of the analyzer device is configured to analyze the behavior of the wireless power receiver device and/or the wireless power transmitter device in reaction to the manipulation, by the means for causing manipulation, of the electromagnetic signals exchanged between the wireless power transmitter and receiver devices, by examining the electric signals generated by the pickup coil of the probe device.

In some embodiments, the system is configured to test a foreign object detection, FOD, ability of the wireless power transmitter device and/or wireless power receiver device by emulating the presence of such a foreign object between the wireless power transmitter device and wireless power receiver device by the means for causing manipulation.

Additionally or alternatively, the system may be configured for controlling the means for causing manipulation to affect one or more data packets carried by the electromagnetic signals between the wireless power transmitter and receiver devices. In this regard, at least one of the data packets may be affected so as to provoke non-compliance with the wireless power transfer protocol for the electromagnetic signals between the wireless power transmitter and receiver devices.

The wireless power transfer protocol referred to in this document may advantageously be a Wireless Power Consortium, WPC, protocol. However, the invention is applicable also to other wireless power transfer protocol, as the skilled person will realize.

A second aspect of the present invention is a method for testing of wireless power equipment in the form of a wireless power transmitter device and/or a wireless power receiver device. The method comprises placing a probe device having a pickup coil between a surface of a housing of the wireless power transmitter device and a surface of a housing of the wireless power receiver device. The method further comprises operating the wireless power transmitter device and the wireless power receiver device to communicate pursuant to a wireless power transfer protocol, and causing manipulation of electromagnetic signals exchanged between the wireless power transmitter and receiver devices.

By the pickup coil of the probe device being placed between the surfaces of the housings of the wireless power transmitter and receiver devices, the method also comprises generating electric signals by capturing the electromagnetic signals exchanged between the wireless power transmitter and receiver devices. The method moreover comprises providing, by the probe device, the generated electric signals to an analyzer device, as well as receiving, by the analyzer device, the generated electric signals from the probe device, and processing, by the analyzer device, the received electric signals.

The method according to the second aspect of the present invention may generally have any or all of the functional features defined in this document for the first aspect of the present invention.

BRIEF DESCRIPTION OF THE DRAWINGS

Objects, features and advantages of embodiments of the invention will appear from the following detailed description, reference being made to the accompanying drawings.

DETAILED DESCRIPTION

Embodiments of the invention will now be described with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular embodiments illustrated in the accompanying drawings is not intended to be limiting of the invention. In the drawings, like numbers refer to like elements.

Figure 1:
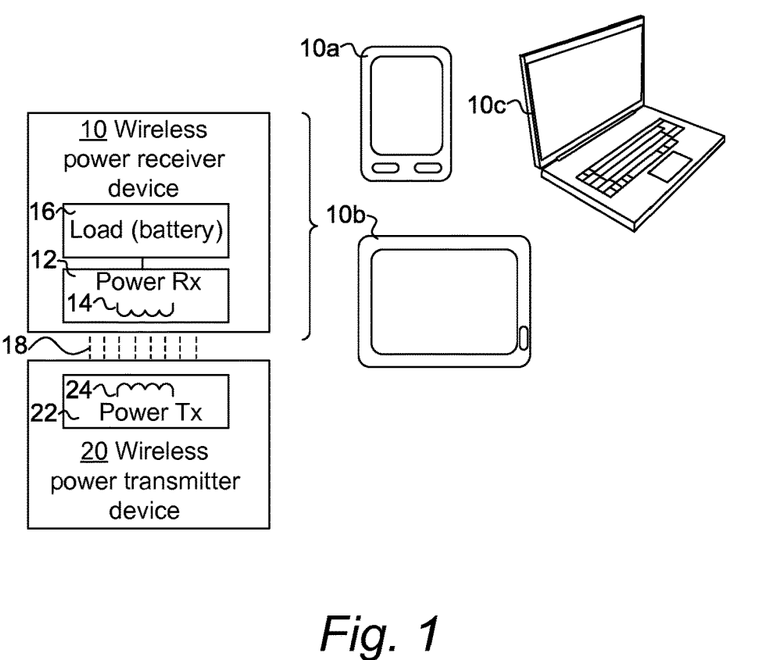
FIG. 1 is a schematic block diagram of a wireless power transmitter device for wireless power transfer to a mobile device.

FIG. 1 illustrates a wireless power transmitter device 20 for wireless power transfer to a wireless power receiver device 10. The wireless power receiver device 10 may, for instance, be a mobile device like a mobile terminal (e.g. smartphone) 10a, tablet computer 10b (e.g. surfpad), laptop computer 10c, camera, audio player, rechargeable toothbrush, wireless headset, or another kind of consumer product or appliance.

The wireless power transfer will be described as being compliant with the Qi standard by the Wireless Power Consortium; hence, the wireless power transmitter device 20 is a base station in the Qi terminology. However, as already mentioned, the invention is generally applicable also to other wireless power transfer standards or approaches, including but not limited to the ones previously mentioned.

The wireless power transmitter device 20 comprises a wireless power transmitter 22 having at least one wireless power transmitter coil 24. Correspondingly, the wireless power receiver device 10 comprises a wireless power receiver 12 having a wireless power receiver coil 14. In operation, the wireless power transmitter device 20 will transfer power wirelessly to the wireless power receiver device 10 by way of magnetic induction 18 via the wireless power transmitter coil 24 and wireless power receiver coil 14.

The power received by the wireless power receiver coil 14 will drive a load 16 in the wireless power receiver device 10. Typically, the load 16 may be a rechargeable battery, such as a lithium ion battery; hence, the wireless power transmitter device 20 will act as a wireless power charger for the wireless power receiver device 10. In another scenario, the load 16 may be electronic circuitry in the wireless power receiver device 10, wherein the wireless power transmitter device 20 will act as a wireless power supply for the wireless power receiver device 10.

Figure 2:
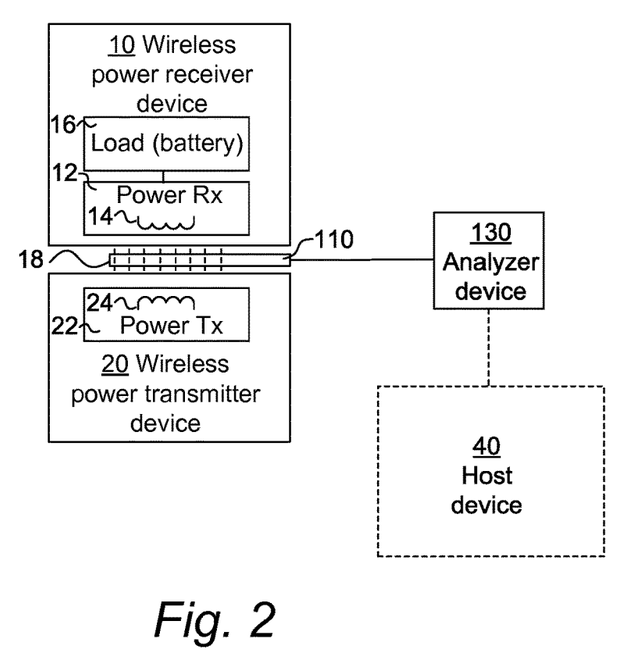
FIG. 2 is a schematic block diagram of a probe device and an analyzer device for testing of wireless power equipment in the form of a wireless power transmitter device and a wireless power receiver device.

In order to test the wireless power equipment comprised by the wireless power transmitter device 20 and the wireless power receiver device 10, a probe device 110 and an analyzer device 130 are provided, as can be seen in FIG. 2. The probe device 110 and the analyzer device 130, and embodiments thereof, will be described in more detail with reference to FIGS. 2 to 7. As is indicated in FIG. 2, the analyzer device 130 may in some embodiments be in communicative connection with a host device 40. The host device 40, when present, may for instance be a laptop computer, a personal computer, a work station, etc., or another kind of computer or computing device.

Figure 3:
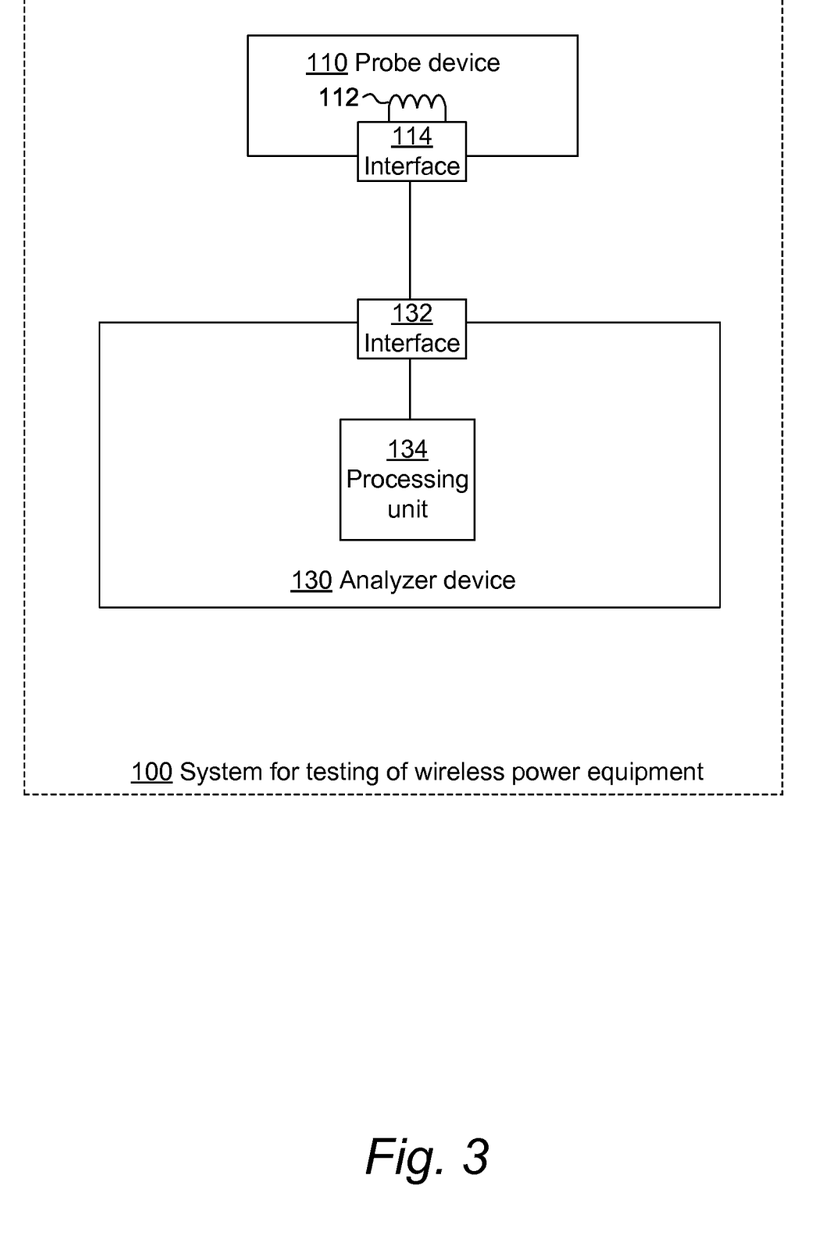
FIG. 3 is a schematic block diagram of a system for testing of wireless power equipment, the system comprising a probe device and an analyzer device.

Reference will now be made to FIG. 3, illustrating in more detail the probe device 110 and analyzer device 130 for testing of wireless power equipment in the form of a wireless power transmitter device, such as device 20 in FIGS. 1 and 2, and a wireless power receiver device, such as device 10 in FIGS. 1 and 2. The probe device 110 comprises at least one pickup coil 112. As can be seen particularly in FIG. 2, the pickup coil 112 is adapted to be placed between a surface of a housing of the wireless power transmitter device 20 and a surface of a housing of the wireless power receiver device 10 to generate electric signals by capturing electromagnetic signals 18 exchanged between the wireless power transmitter and receiver devices 20, 10 pursuant to a wireless power transfer protocol. The wireless power transfer protocol may, for instance, be a Wireless Power Consortium, WPC, protocol.

The probe device 110 moreover comprises an interface 114 for providing the electric signals generated by the pickup coil 112 to the analyzer device 130. In some embodiments, the interface 114 may be as simple as two lead wires from the pickup coil 112, i.e. a galvanic interface. In other embodiments, the interface 114 may be a contact interface or a cable communication interface, such as for instance an XLR contact interface, or a wireless communication interface such as, for instance, Bluetooth.

In one or more embodiments, the probe device 110 further comprises a planar non-conductive base sheet being dimensioned for placement between the surface of the housing of the wireless power transmitter device 20 and the surface of the housing of the wireless power receiver device 10, wherein the at least one pickup coil 112 is carried by the planar non-conductive base sheet.

In such embodiments, the planar non-conductive base sheet may, for instance, comprise any of the following: a flexible printed circuit, FPC, substrate; a printed circuit board, PCB, substrate; a plastic film; or a glass sheet. This list of possible materials is however non-exhaustive; other materials can also be used as will be readily realized by a skilled person. The planar non-conductive base sheet may, for instance, have a thickness in the order of 0.1 to 1 mm.

The probe device 110 may further comprise a thermal sensor 116, carried by the planar non-conductive base sheet. Such a thermal sensor 116 can be seen for the embodiment shown in FIG. 4. The thermal sensor 116 is adapted for measurement of temperature between the surface of the housing of the wireless power transmitter device 20 and the surface of the housing of the wireless power receiver device 10. In embodiments having such a thermal sensor 116, the interface 114 will typically be coupled also to the thermal sensor 116 and will thus be adapted to provide also the temperature measurements provided by the thermal sensor 116 to the analyzer device 130.

The analyzer device 130 is for testing of wireless power equipment in the form of a wireless power transmitter device, such as device 20 in FIGS. 1 and 2, and a wireless power receiver device, such as device 10 in FIGS. 1 and 2. As can be seen in FIG. 3, the analyzer device 130 comprises an interface 132 for receiving the electric signals generated by the pickup coil 112 of the probe device 110, when the probe device 110 is being placed between a surface of the housing of the wireless power transmitter device 20 and a surface of the housing of the wireless power receiver device 10 and is capturing electromagnetic signals 18 exchanged between the wireless power transmitter and receiver devices 20, 10 pursuant to the wireless power transfer protocol.

The analyzer device 130 also comprises a processing unit 134 coupled to the interface 132 and configured for processing of the received electric signals.

Figure 4:
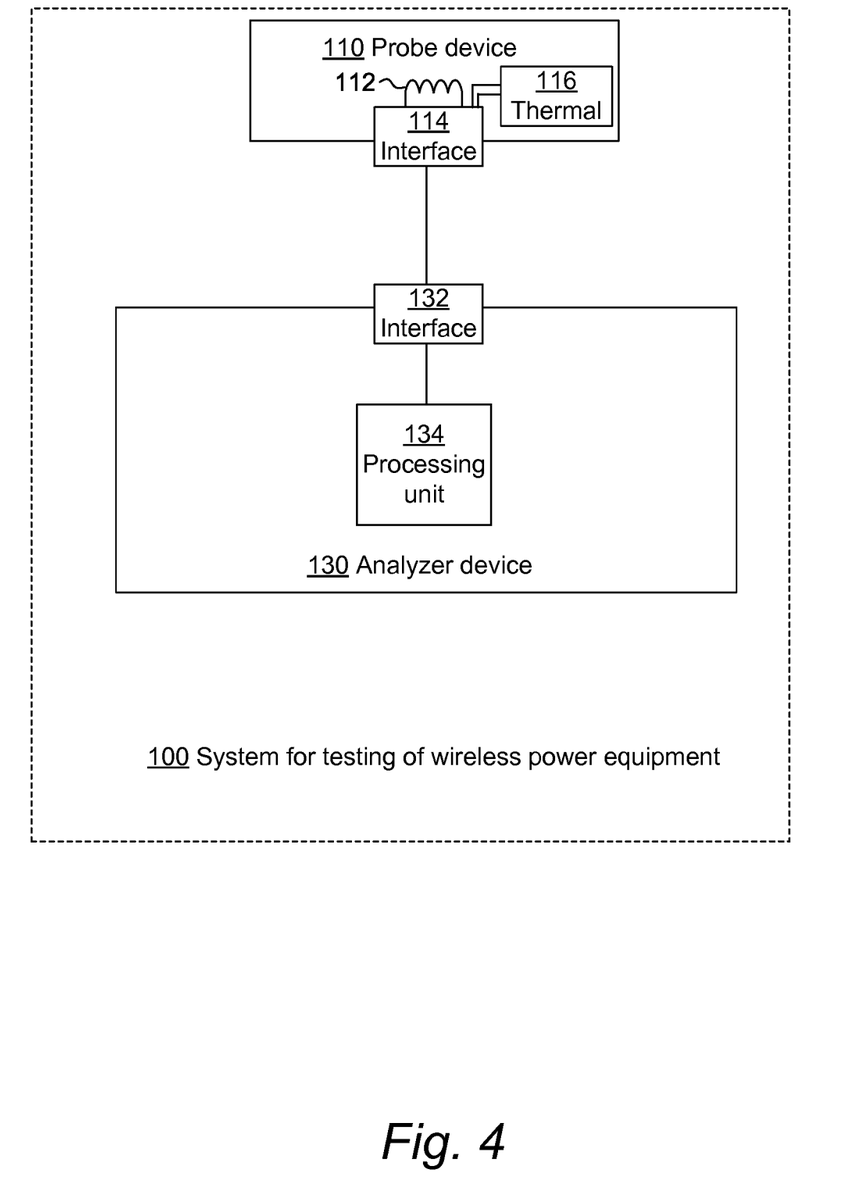
FIG. 4 is a schematic block diagram of an embodiment of the system for testing of wireless power equipment as shown in FIG. 3.

For embodiments of the probe device 110 which has a thermal sensor 116, the processing unit 134 of the analyzer device 130 may be further configured for processing of the temperature measurements provided by the thermal sensor 116 of the probe device 110. This may serve to analyze the thermal environment of the region between the surfaces of the wireless power transmitter and receiver devices 20, 10, for instance as a result of one of them being subject to overheating caused by the wireless power transfer between the devices 20, 10.

As can be seen in FIG. 3, the probe device 110 and the analyzer device 130 constitutes a system 100 for testing of wireless power equipment in the form of a wireless power transmitter device, e.g. device 20, and a wireless power receiver device, e.g. device 10.

The system 100 further comprises means for causing manipulation of the electromagnetic signals 18 exchanged between the wireless power transmitter and receiver devices 20, 10. The means for causing manipulation of the electromagnetic signals may, for instance, comprise a resistive element 136 coupled to impose a controllable load on the pickup coil 112 of the probe device 110 and is, advantageously, controllable by the processing unit 134 of the analyzer device 130.

Figure 5:
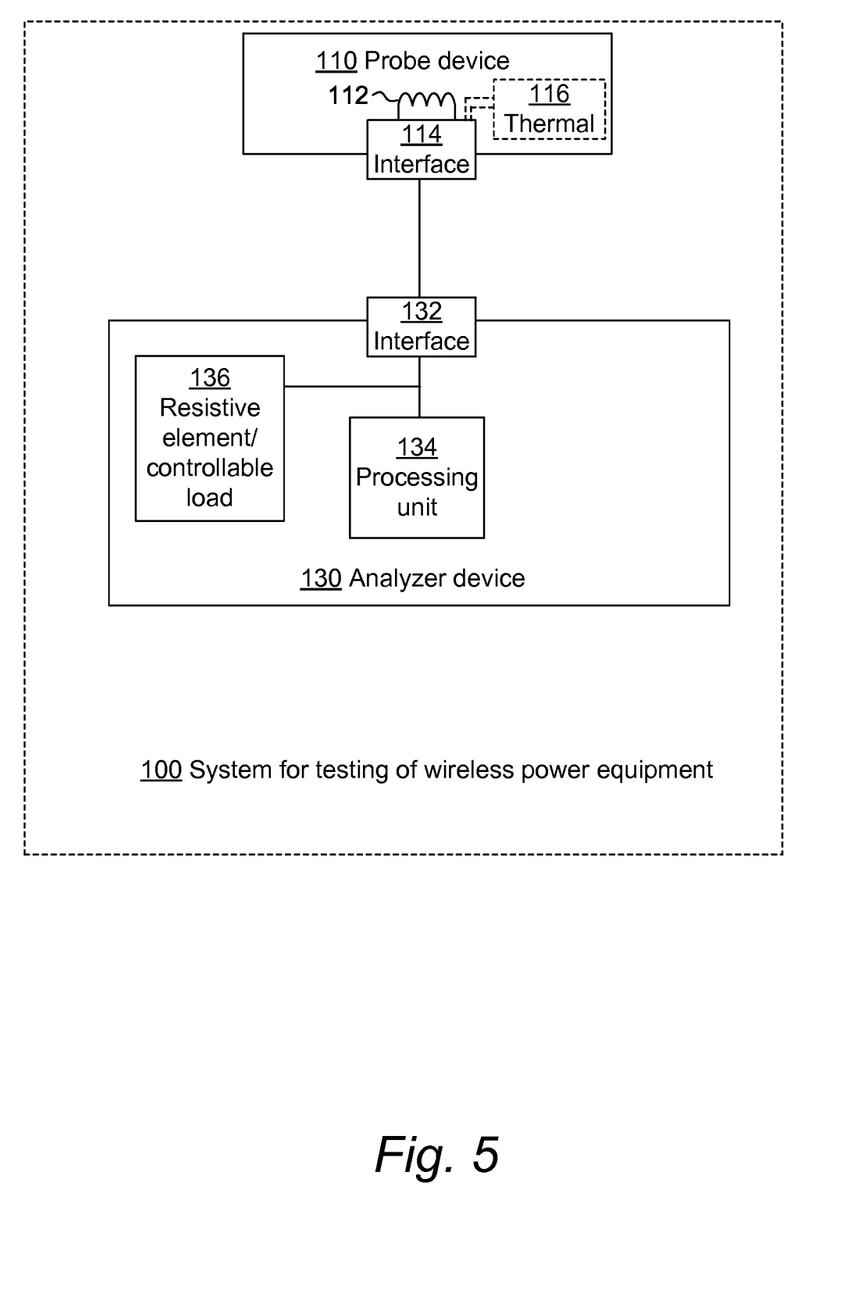
FIG. 5 is a schematic block diagram of another embodiment of the system for testing of wireless power equipment as shown in FIG. 3.

Such a resistive element 136 is indicated for the embodiment seen in FIG. 5. In this embodiment, the resistive element 136 is comprised in the analyzer device 130, thus being connected to the pickup coil 112 of the probe device 110 via the interfaces 132, 114 of the analyzer device 130 and the probe device 110, wherein the resistive element 136 is controllable by the processing unit 134 of the analyzer device 130.

In other embodiments, the resistive element 136 may be an external element connected to the analyzer device 130, thus being connected to the pickup coil 112 of the probe device 110 via the interfaces 132, 114 of the analyzer device 130 and the probe device 110, wherein the resistive element 136 is controllable by the processing unit 134 of the analyzer device 110 or by an external device comprising the resistive element 136.

In still other embodiments, the resistive element 136 may be comprised in the probe device 110 and be coupled to the pickup coil 112 therein, wherein the resistive element 136 is controllable by the processing unit 134 of the analyzer device 130 via the interfaces 132, 114 of the analyzer device 130 and the probe device 110.

Thanks to the provision of the controllable load (for instance imposed by the resistive element 136), the system 100 may be configured for controllable interception, e.g. by the resistive element 136, of wireless power transmitted by the wireless power transmitter device 20, so as to cause transfer of less wireless power than expected between the wireless power transmitter and receiver devices 20, 10.

Figure 6:
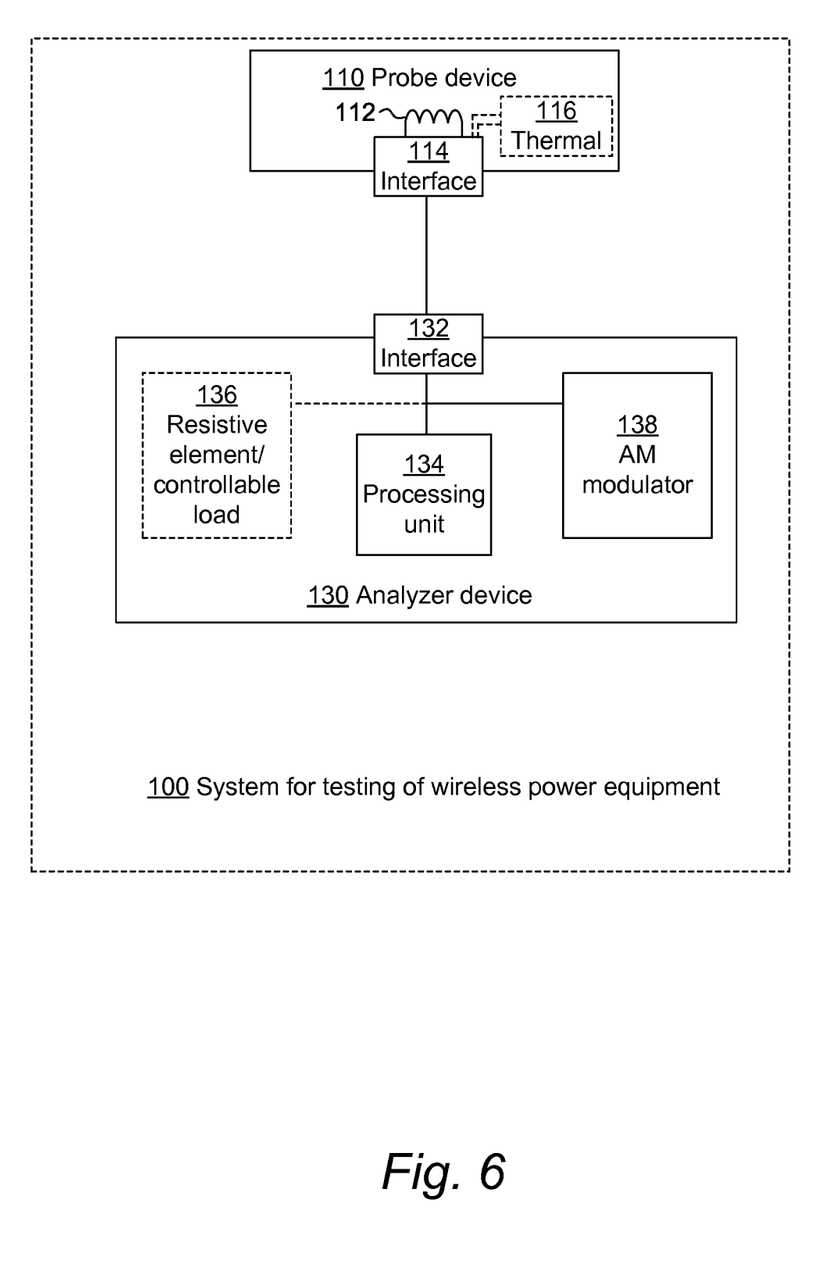
FIG. 6 is a schematic block diagram of yet another embodiment of the system for testing of wireless power equipment as shown in FIG. 3.

In some embodiments, as can be seen for instance in FIG. 6, the means for causing manipulation of the electromagnetic signals 18 comprises an AM modulator 138 for causing an amplitude modulation of the electromagnetic signals exchanged between the wireless power transmitter and receiver devices 20, 10, wherein the AM modulator is controllable by the processing unit 134 of the analyzer device 130.

In different embodiments, the AM modulator 138 may be comprised in the analyzer device 130 (as seen in FIG. 6), or be comprised in the probe device 110, or in an external device connected to the analyzer device 130.

The processing unit 134 of the analyzer device 130 may be configured to analyze the behavior of the wireless power receiver device 10 and/or the wireless power transmitter device 20 in reaction to the manipulation, by the means for causing manipulation (such as, for instance, the resistive element 136 or the AM modulator 138) of the electromagnetic signals 18 exchanged between the wireless power transmitter and receiver devices 20, 10, by examining the electric signals generated by the pickup coil 112 of the probe device 110.

The system 100 may, for instance, be configured to test a foreign object detection, FOD, ability of the wireless power transmitter device 20 and/or wireless power receiver device 10 by emulating the presence of such a foreign object between the wireless power transmitter device 20 and wireless power receiver device 10 by the means 136, 138 for causing manipulation.

In some embodiments, the processing unit 134 of the analyzer device 130 may be configured for controlling the means 136, 138 for causing manipulation to affect one or more data packets carried by the electromagnetic signals 18 between the wireless power transmitter and receiver devices 20, 10. One purpose may be to affect the at least one of the data packets so as to provoke non-compliance with the wireless power transfer protocol for the electromagnetic signals 18 between the wireless power transmitter and receiver devices 20, 10.

Figure 7:
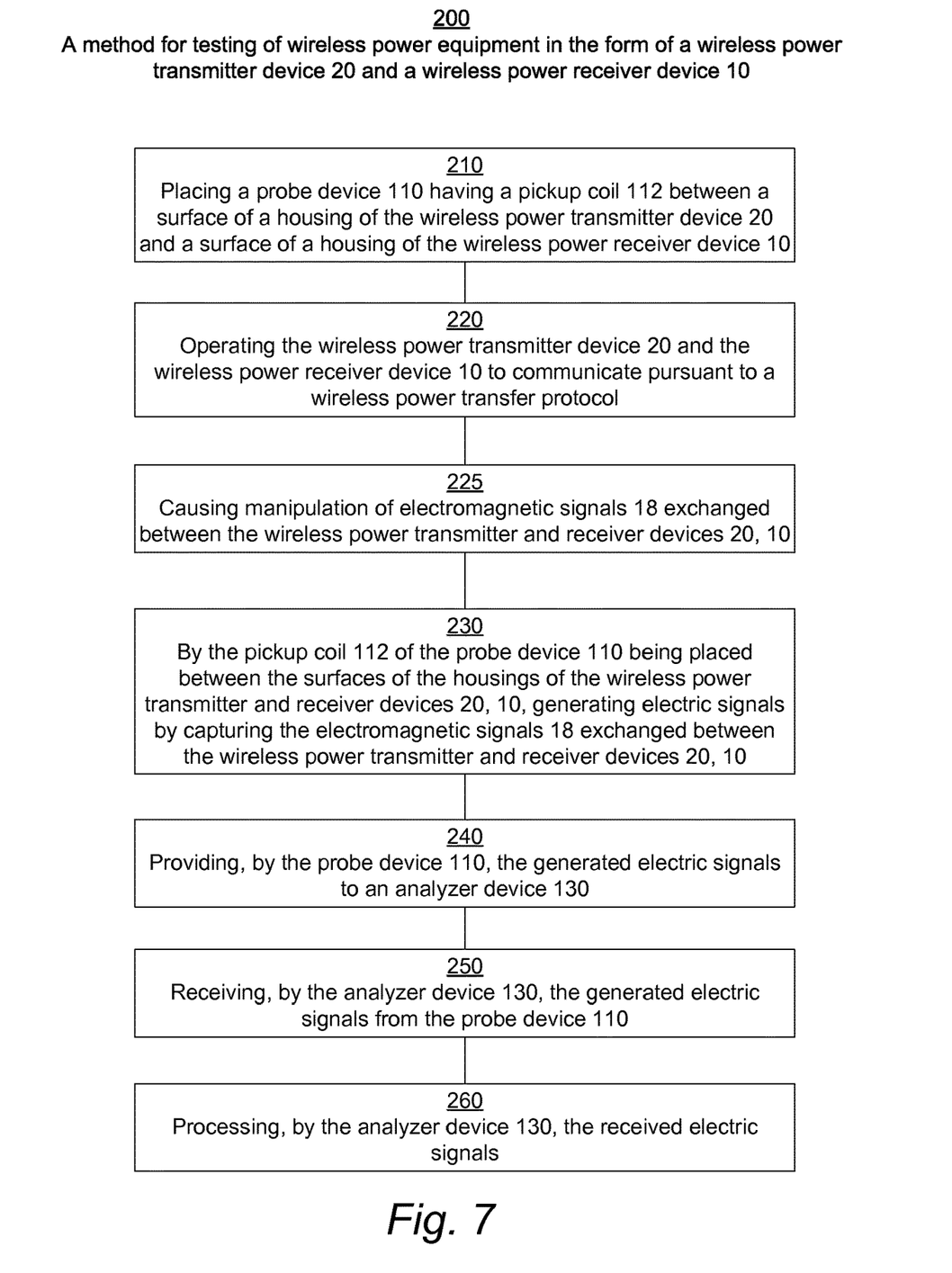
FIG. 7 is a schematic flowchart diagram of a method for testing of wireless power equipment in the form of a wireless power transmitter device and a wireless power receiver device.

A method 200 for testing of wireless power equipment in the form of a wireless power transmitter device (e.g. device 20) and a wireless power receiver device (e.g. device 10) is illustrated in FIG. 7.

The method 200 comprises a first step 210 of placing a probe device 110 having a pickup coil 112 between a surface of a housing of the wireless power transmitter device 20 and a surface of a housing of the wireless power receiver device 10.

A second step 220 involves operating the wireless power transmitter device 20 and the wireless power receiver device 10 to communicate pursuant to a wireless power transfer protocol.

A third step 225 involves causing manipulation 225 of electromagnetic signals 18 exchanged between the wireless power transmitter and receiver devices 20, 10. The manipulation in step 225 may be caused by the aforementioned means 136, 138 for causing manipulation in any of its possible embodiments.

By the pickup coil 112 of the probe device 110 being placed between the surfaces of the housings of the wireless power transmitter and receiver devices 20, 10, electric signals are then generated in a fourth step 230 by capturing the electromagnetic signals 18 exchanged between the wireless power transmitter and receiver devices 20, 10.

In a fifth step 240, the generated electric signals are then provided to an analyzer device 130.

A sixth step 250 involves receiving, by the analyzer device 130, the generated electric signals from the probe device 110.

Finally, in a seventh step 260, the received electric signals are processed by the analyzer device 130.

Beneficially, the steps of this method are performed without the wireless power transmitter device 20 and the wireless power receiver device 10 being able to notice that the probe device 110 is placed between them. This may, for instance, be used for testing the compliance of the wireless power transmitter device 20 and/or the wireless power receiver device 10 with the wireless power transfer protocol, such as WPC.

The method 200 may be used for testing or tuning the performance of the wireless power transmitter device 20 when determining a reference quality factor of a wireless power transmitter coil thereof under the influence of a wireless power receiver coil of a wireless power receiver, such as the wireless power receiver device 10. This will now be further explained.

As is well known per se, quality factor is defined as the ratio between reactance and resistance of an inductor. In the wireless power scenario the inductor is a wireless power transmitter coil and its $Q_0$ or (reference) quality factor is defined as $Q=(2·\pi·f·L)/R$, where f is the frequency of interest, L is the self inductance of the wireless power transmitter coil and R is the equivalent series resistance (ESR) of the wireless power transmitter coil (ideal components have 0 resistance, but practical components have a resistive element to them).

When a wireless power receiver is placed on top of the transmitter coil, the presence of this power receiver will change the L and R parameters of the transmitter coil. Accordingly, the (reference) quality factor will also change.

The (reference) quality factor is often used to estimate the amount of losses or friendly metals in a power receiver product (PRx). A lower (reference) quality factor usually indicates higher losses in the PRx.

Many power transmitter products (PTx) use measurement circuits to determine the reference quality factor as influenced by the device to be charged (PRx). This helps to predict system losses (related to efficiency and thermal performance), and to prevent heating of foreign objects (related to product safety).

With the probe device 110 inserted in between the PTx and PRx it can utilize two different methods to reduce the reference quality factor as measured/observed by the PTx under the influence of the PRx. It can do this with much higher precision than the state-of-the art in emulating power losses in a wireless power system. This helps greatly in tuning and testing the performance of quality factor measurement in the PTx. It also facilitates much more precise testing of the impact of foreign objects in a wireless power system. Finally, it enables to emulate how PRx or PTx device deterioration will affect the system performance.

Two examples are given below on how the probe device 110 can reduce the observed (reference) quality factor:
1. By connecting a specific load to the pickup coil 112 of the probe device 100, thereby causing loss of the electro-magnetic field. By varying this load from, for instance, infinite (open circuit) to, for instance, zero (short circuit), the observed (reference) quality factor can be reduced from, for instance, $Q_0$ to, for instance, 0. $Q_0$ is the reference quality factor of the wireless power transmitter coil in the PTx.
2. By physically adding small pieces of metal on the same carrier of the pickup coil 112 of the probe device 100, antenna additional losses can be introduced in the system (as foreign objects or friendly metals would). By varying the material, thickness, surface, position and other properties the observed (reference) quality factor can be varied from, for instance, $Q_0$ to 0.

In consideration of the above, one embodiment of the method 200 is directed at testing or tuning the performance of the wireless power transmitter device 20 when determining a (reference) quality factor of a wireless power transmitter coil thereof under the influence of a wireless power receiver coil of a wireless power receiver, such as the wireless power receiver device 10. The (reference) quality factor is defined as a ratio between reactance and resistance of the wireless power transmitter coil. The testing or tuning involves controlling a controllable load (such as the aforementioned resistive element 136) of the pickup coil 112 of the probe device 110 to vary between a first load, such as infinite (open circuit), and a second lower load, such as 0 (short circuit). This causes a controlled change in the (reference) quality factor observed by the wireless power transmitter device 20 between a first (reference) quality factor, such as $Q_0$, and a second lower (reference) quality factor, such as 0.

In further consideration of the above, another embodiment of the method 200 is as follows. The testing or tuning involves adding pieces of conductive material, such as metal, to a planar non-conductive base sheet of the probe device 110. By varying at least one property of the pieces of conductive material, such as material, thickness, mass, surface or position, a controlled change is caused in the (reference) quality factor observed by the wireless power transmitter device 20 between a first (reference) quality factor, such as $Q_0$, and a second lower (reference) quality factor, such as 0.

The invention has been described above in detail with reference to some embodiments thereof. However, as is readily understood by those skilled in the art, other embodiments are equally possible within the scope of the present invention, as defined by the appended claims. For instance, embodiments of the present invention may be used with machine learning or artificial intelligence. By subjecting wireless power equipment to repeated tests and feeding the outcome of the tests to a neural network or other structure for machine learning or artificial intelligence, knowledge may be developed on how to improve the safety, reliability or interoperability of wireless power equipment.

The invention claimed is:

1. A system for testing of wireless power equipment in the form of a wireless power transmitter device and a wireless power receiver device, the system comprising:
a probe device comprising:
at least one pickup coil, the pickup coil being adapted to be placed between a surface of a housing of the wireless power transmitter device and a surface of a housing of the wireless power receiver device to generate electric signals by capturing electromagnetic signals exchanged between the wireless power transmitter and receiver devices pursuant to a wireless power transfer protocol, and
an interface for providing the electric signals generated by the pickup coil to an analyzer device;
an analyzer device comprising:
an interface for receiving the electric signals generated by the pickup coil of the probe device, when the probe device is placed between the surface of the housing of the wireless power transmitter device and the surface of the housing of the wireless power receiver device and captures the electromagnetic signals exchanged between the wireless power transmitter and receiver devices, and
a processing unit coupled to the interface and configured for processing of the received electric signals; and
means connected with the pickup coil of the probe device and adapted for causing manipulation of the electromagnetic signals exchanged between the wireless power transmitter and receiver devices,
wherein the processing unit of the analyzer device is configured to analyze the behavior of the wireless power receiver device and/or the wireless power transmitter device in reaction to the manipulation, by the means for causing manipulation, of the electromagnetic signals exchanged between the wireless power transmitter and receiver devices, by examining the electric signals generated by the pickup coil of the probe device.

2. The system as defined in claim 1, wherein the means for causing manipulation of the electromagnetic signals comprises a resistive element coupled to impose a controllable load on the pickup coil of the probe device.

3. The system as defined in claim 2, wherein the resistive element is comprised in the analyzer device, being connected to the pickup coil of the probe device via the interfaces of the analyzer device and the probe device, and
wherein the resistive element is controllable by the processing unit of the analyzer device.

4. The system as defined in claim 2, wherein the resistive element is an external element connected to the analyzer device, being connected to the pickup coil of the probe device via the interfaces of the analyzer device and the probe device, and
wherein the resistive element is controllable by the processing unit of the analyzer device.

5. The system as defined in claim 2, wherein the resistive element is comprised in the probe device and coupled to the pickup coil therein, and wherein the resistive element is controllable by the processing unit of the analyzer device via the interfaces of the analyzer device and the probe device.

6. The system as defined in claim 2, wherein the system is configured for controllable interception, by the resistive element, of wireless power transmitted by the wireless power transmitter device, so as to cause transfer of less wireless power than expected between the wireless power transmitter and receiver devices.

7. The system as defined in claim 1, wherein the means for causing manipulation of the electromagnetic signals comprises:
an AM modulator for causing an amplitude modulation of the electromagnetic signals exchanged between the wireless power transmitter and receiver devices, the AM modulator being controllable by the processing unit of the analyzer device.

8. The system as defined in claim 7, wherein the AM modulator is comprised in the analyzer device.

9. The system as defined in claim 7, wherein the AM modulator is comprised in the probe device.

10. The system as defined in claim 7, wherein the AM modulator is comprised in an external device connected to the analyzer device.

11. The system as defined in claim 1, wherein the system is configured to test a foreign object detection, FOD, ability of the wireless power transmitter device and/or wireless power receiver device by emulating the presence of such a foreign object between the wireless power transmitter device and wireless power receiver device by the means for causing manipulation.

12. The system as defined in claim 1, wherein the processing unit of the analyzer device is configured for controlling the means for causing manipulation to affect one or more data packets carried by the electromagnetic signals between the wireless power transmitter and receiver devices.

13. The system as defined in claim 12, wherein at least one of the data packets is affected so as to provoke non-compliance with the wireless power transfer protocol for the electromagnetic signals between the wireless power transmitter and receiver devices.

14. The system as defined in claim 1, wherein the probe device further comprises:
   a planar non-conductive base sheet being dimensioned for placement between the surface of the housing of the wireless power transmitter device and the surface of the housing of the wireless power receiver device,
   wherein the at least one pickup coil is carried by the planar non-conductive base sheet.

15. The system as defined in claim 14,
   wherein the probe device further comprises a thermal sensor, carried by the planar non-conductive base sheet and being adapted for measurement of temperature between the surface of the housing of the wireless power transmitter device and the surface of the housing of the wireless power receiver device,
   wherein the interface of the probe device is coupled also to the thermal sensor and is adapted to provide the temperature measurements provided by the thermal sensor to the analyzer device, and
   wherein the processing unit of the analyzer device is further configured for processing of the temperature measurements provided by the thermal sensor of the probe device.

16. The system as defined in claim 14,
   wherein the interface of the probe device is selected from the group consisting of:
      a cable communication interface,
      a contact interface,
      a wireless communication interface, and
      a galvanic interface;
   wherein the planar non-conductive base sheet of the probe device is selected from the group consisting of:
      a flexible printed circuit, FPC, substrate,
      a printed circuit board, PCB, substrate,
      a plastic film, and
      a glass sheet;
   and wherein the planar non-conductive base sheet has a thickness in the order of 0.1 to 1 mm.

17. The system as defined in claim 1, wherein the wireless power transfer protocol is a Wireless Power Consortium, WPC, protocol.

18. A method for testing of wireless power equipment in the form of a wireless power transmitter device and a wireless power receiver device, the method comprising:
   placing a probe device having a pickup coil between a surface of a housing of the wireless power transmitter device and a surface of a housing of the wireless power receiver device;
   operating the wireless power transmitter device and the wireless power receiver device to communicate pursuant to a wireless power transfer protocol;
   by the pickup coil of the probe device being placed between the surfaces of the housings of the wireless power transmitter and receiver devices:
      causing manipulation of electromagnetic signals exchanged between the wireless power transmitter and receiver devices; and
      generating electric signals by capturing the electromagnetic signals exchanged between the wireless power transmitter and receiver devices;
   providing, by the probe device, the generated electric signals to an analyzer device;
   receiving, by the analyzer device, the generated electric signals from the probe device; and
   processing, by the analyzer device, the received electric signals to analyze the behavior of the wireless power receiver device and/or the wireless power transmitter device in reaction to the manipulation of the electromagnetic signals exchanged between the wireless power transmitter and receiver devices.

19. The method as defined in claim 18, further involving testing or tuning the performance of the wireless power transmitter device when determining a (reference) quality factor of a wireless power transmitter coil thereof under the influence of a wireless power receiver coil of a wireless power receiver, the (reference) quality factor being defined as a ratio between reactance and resistance of the wireless power transmitter coil, by:
   causing said manipulation of the electromagnetic signals exchanged between the wireless power transmitter and receiver devices by controlling a controllable load of the pickup coil of the probe device to vary between a first load and a second load, said second load being lower than said first load, thereby causing a controlled change in the (reference) quality factor observed by the wireless power transmitter device between a first (reference) quality factor and a second (reference) quality factor, said second (reference) quality factor being lower than said first (reference) quality factor.

20. The method as defined in claim 19, wherein:
   said wireless power receiver is said wireless power receiver device,
   said first load is infinite (open circuit),
   said second load is 0 (short circuit),
   said first (reference) quality factor is $Q_0$, and
   said second (reference) quality factor is 0.

21. The method as defined in claim 19, wherein the (reference) quality factor is defined as $$Q=(2 \cdot \pi \cdot f \cdot L)/R, \text{ where:}$$

f is the frequency of interest,
   L is the self inductance of the wireless power transmitter coil, and
   R is the equivalent series resistance, ESR, of the wireless power transmitter coil.

22. The method as defined in claim 18, further involving testing or tuning the performance of the wireless power transmitter device when determining a (reference) quality factor of a wireless power transmitter coil thereof under the influence of a wireless power receiver coil of a wireless power receiver, the (reference) quality factor being defined as a ratio between reactance and resistance of the wireless power transmitter coil, by:
   causing said manipulation of the electromagnetic signals exchanged between the wireless power transmitter and receiver devices by adding pieces of conductive material to a planar non-conductive base sheet of the probe device; and
   varying at least one property of the pieces of conductive material, thereby causing a controlled change in the (reference) quality factor observed by the wireless power transmitter device between a first (reference) quality factor and a second (reference) quality factor, said second (reference) quality factor being lower than said first (reference) quality factor.

23. The method as defined in claim 22, wherein:
   said wireless power receiver is said wireless power receiver device,
   said conductive material is metal, said at least one property of the pieces of conductive material is selected from the group consisting of: material, thickness, mass, surface and position,
said first (reference) quality factor is $Q_0$, and
said second (reference) quality factor is 0.

24. The method as defined in claim 22, wherein the (reference) quality factor is defined as $Q = (2 \cdot \pi \cdot f \cdot L)/R$, where:

f is the frequency of interest,
L is the self inductance of the wireless power transmitter coil, and
R is the equivalent series resistance, ESR, of the wireless power transmitter coil.

\* \* \* \* \*